(12) United States Patent
Kent

(10) Patent No.: US 12,136,162 B2
(45) Date of Patent: Nov. 5, 2024

(54) SYSTEMS AND METHODS FOR RENDERING TABLES

(71) Applicant: Canva Pty Ltd, Surry Hills (AU)

(72) Inventor: Cieran James Kent, Surry Hills (AU)

(73) Assignee: Canva Pty Ltd, Surry Hills (AU)

( * ) Notice: Subject to any disclaimer, the term of this patent is extended or adjusted under 35 U.S.C. 154(b) by 46 days.

(21) Appl. No.: 17/994,383

(22) Filed: Nov. 27, 2022

(65) Prior Publication Data

US 2023/0177764 A1    Jun. 8, 2023

(30) Foreign Application Priority Data

Dec. 6, 2021 (AU) ................................ 2021282391

(51) Int. Cl.
*G06T 15/04* (2011.01)
*G06F 30/12* (2020.01)

(52) U.S. Cl.
CPC ............. *G06T 15/04* (2013.01); *G06F 30/12* (2020.01); *G06T 2200/24* (2013.01)

(58) Field of Classification Search
CPC ............................ G06T 15/04; G06T 2200/24
See application file for complete search history.

(56) References Cited

U.S. PATENT DOCUMENTS

| | | | | |
|---|---|---|---|---|
| 9,613,086 B1 * | 4/2017 | Sherman | ............... | G06F 16/248 |
| 2003/0229856 A1 * | 12/2003 | Lynn | ..................... | G06F 40/166 |
| | | | | 715/269 |
| 2005/0168782 A1 * | 8/2005 | Kobashi | ................ | G06F 40/174 |
| | | | | 358/1.18 |
| 2014/0181788 A1 * | 6/2014 | Sullivan | ..................... | G06F 8/38 |
| | | | | 717/109 |
| 2019/0095413 A1 * | 3/2019 | Davis | ..................... | H04L 67/565 |
| 2019/0187962 A1 * | 6/2019 | Stachura | ............... | G06F 40/109 |

OTHER PUBLICATIONS

Philo, Andrea, "Microsoft Word 2016 Step-by-Step Guide a MC-NPL Computer Lab Lesson Plan", Feb. 2020, MC-NPL, pp. 1-103 (Year: 2020).*
"Word—Tables", Sep. 2020, GCFGlobal, pp. 1-11 (Year: 2020).*

* cited by examiner

*Primary Examiner* — Terrell M Robinson
(74) *Attorney, Agent, or Firm* — GrowIP Law Group LLC

(57) ABSTRACT

A computer implemented method for rendering a table is described. The table includes intersections formed by a plurality of lines, each of the plurality of lines associated with at least a first attribute. The method includes, for one or more of the intersections, matching a value of the first attribute of a first line of the plurality of lines with a value of the first attribute for at least a second line of the plurality lines, wherein the second line is different to the first line and based on the matching, rendering a displayed area of the intersection with a value for the first attribute that matches the value of the first attribute of the first line. The value of the first attribute defines an appearance of the line, for example the line fill colour, when the table is rendered on a display device.

18 Claims, 6 Drawing Sheets
(2 of 6 Drawing Sheet(s) Filed in Color)

SYSTEMS AND METHODS FOR RENDERING TABLES

CROSS-REFERENCE TO RELATED APPLICATION

This application is a U.S. Non-Provisional application that claims priority to Australian Patent Application No. 2021282391, filed Dec. 6, 2021, which is hereby incorporated by reference in its entirety.

TECHNICAL FIELD

Aspects of the present disclosure are directed to computational systems and methods for rendering tables on a display device.

BACKGROUND

Various computer implemented tools for creating, editing, and/or publishing designs that include one or more tables exist.

Typically, a given design tool provides various types of design elements that may form a part of, or be included in, a table. For example a design element may be borders of the table, which borders may be external around one more sides of the periphery of the table and/or internal, around one or more sides of individual cells of the table.

The borders of table may have a number of attributes, settable by a user of the design tool. An example attribute is the width of a line representing the border. Another example attribute is the colour of the border. The user may be able to set the attributes for a table as a whole, for component parts of the table formed by one or more cells, for example an individual cell, a row or a column and/or for individual borders, for example a border along one side of a cell or a border along one side of a group of cells.

SUMMARY

Example embodiments described herein are directed to a computer implemented method for rendering a table, the method including, for at least one intersection formed by a plurality of lines of a table, each of the plurality of lines associated with at least a first attribute: matching a value of the first attribute of a first line of the plurality of lines with a value of the first attribute for at least a second line of the plurality lines, wherein the second line is different to the first line; and based on the matching, rendering a displayed area of the intersection with a value for the first attribute that matches the value of the first attribute of the first line. The value of the first attribute defines an appearance of the line when the table is rendered on a display device.

In some embodiments, the first attribute is a colour attribute and the determined value for each of the plurality of lines specifies a colour for the line. The colour of the line may be the fill colour. The detailed description primarily refers to these embodiments.

In some embodiments, the at least one intersection is an intersection that has been determined to be formed by a plurality of lines of equal weight, which lines are the lines of the intersection with the highest weight.

In some embodiments the displayed area of the intersection is defined by an area of cross-over of the plurality of lines of equal weight. In other embodiments the displayed area of the intersection is a node that encompasses an area of cross-over of the plurality of lines.

In some embodiments the method further includes matching a value of the first attribute of a third line of the plurality of lines with at least a value of the first attribute for a fourth line of the plurality lines, wherein the first, second, third and fourth lines are different lines. The rendering with the value for the first attribute that matches the value of the first attribute of the first line is then based on the first line having a higher positional dominance than the third line and the fourth line.

Example embodiments described herein are directed to a computer processing system including a processing unit, a display and a non-transient computer-readable storage medium storing instructions, which when executed by the processing unit, cause the processing unit to render on the display a table by performing the method described in the immediately preceding paragraphs or a method described in the following description.

Example embodiments described herein are directed to a non-transient computer-readable storage medium storing instructions, which when executed by a processing unit, cause the processing unit to render on a display a table, by performing the method described in the immediately preceding paragraphs or a method described in the following description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
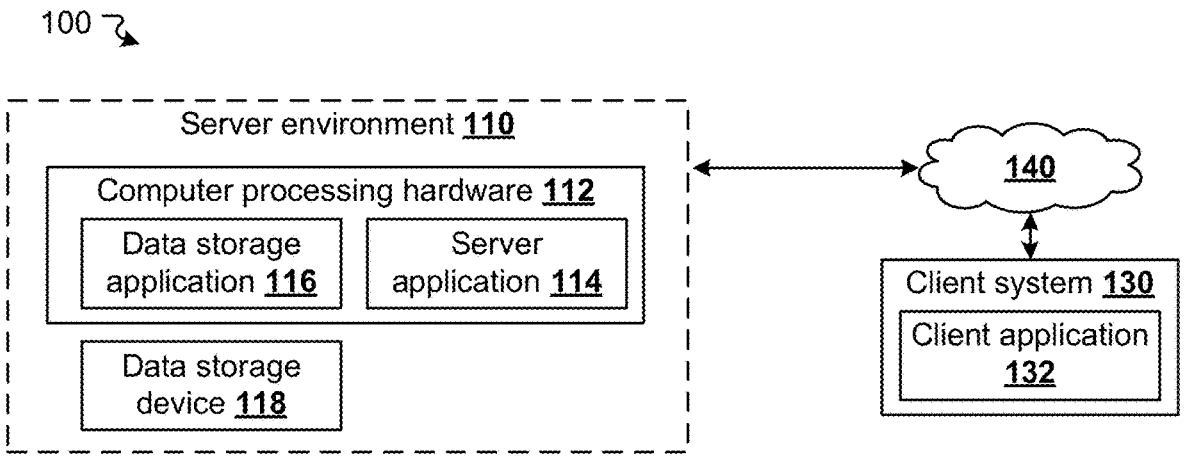
FIG. 1 is a diagram depicting a networked environment in which various features of the present disclosure may be implemented.

In the description numerous specific details are set forth, including in and with reference to the accompanying drawings, in order to provide a thorough understanding of the present invention. It will be apparent, however, that the present invention may be practiced without these specific details. In some instances, well-known structures and devices are shown in block diagram form in order to avoid unnecessary obscuring.

Design creation tools can provide an array of options that enable users add design elements to a design incorporating a table, and manipulate design elements once added to a design including changing one or more attributes of one or more design elements. Providing such an array of options is advantageous as it allows users flexibility to create a table design of their choice. On the other hand, including an array of options can increase the complexity of the problem of providing a user with the ability to readily produce visually appealing, consistent and predictable table designs.

The present disclosure provides what will be referred to as a mechanism for rendering a table in a design. The design may consist only of the table or the table may form part of a design that includes other design elements. The mechanism for rending a table in a design is provided by a design platform. In the present embodiments, the design platform is provided by a client server architecture, such as that shown in networked environment 100 of FIG. 1.

The following description is made with reference to a rectangular table, including a rectangular outer peripheral shape and rectangular cell shapes. The examples show a uniform cell size. However, the present disclosure is not limited to such rectangular tables and the processes for rendering a table may be applied to other table and cell shapes and to non-uniform tables.

The networked environment 100 includes a server environment 110 and a client system 130, which communicate via one or more communications networks 140 (e.g. the Internet).

Generally speaking, server environment 110 includes computer processing hardware 112 on which one or more applications are executed that provide server-side functionality to client applications. In the present example, the computer processing hardware 112 of the server environment 110 runs a server application 114 (which may also be referred to as a front end server application) and a data storage application 116.

The server application 114 operates to provide an endpoint for a client application, for example a client application 132 on the client system 130, which is accessible over communications network 140. To do so, the server application 114 may include one or more application programs, libraries, APIs or other software elements that implement the features and functions that are described herein. By way of example, where the server application 114 serves web browser client applications, the server application 114 will be a web server which receives and responds to, for example, HTTP application protocol requests. Where the server application 114 serves native client applications, the server application 114 will be an application server configured to receive, process, and respond to API calls from those client applications The server environment 110 may include both web server and application server applications allowing it to interact with both web and native client applications.

In addition to the specific functionality described herein, the server application 114 (alone or in conjunction with other applications) may provide additional functions that are typically provided by server systems—for example user account creation and management, user authentication, and/ or other server side functions.

The data storage application 116 operates to receive and process requests to persistently store and retrieve data in data storage that is relevant to the operations performed/ services provided by the server environment 110. Such requests may be received from the server application 114, other server environment applications, and/or (in some instances) directly from client applications such as the client application 132. Data relevant to the operations performed/ services provided by the server environment may include, for example, user account data, design data (i.e. data describing designs that have been created by users), data defining design assets and/or other data relevant to the operation of the server application 114. Design assets may be stored in one or more libraries and may include, for example, various types of assets that users can use to create designs. Such assets may include, for example, design elements, design templates, predefined styles or formatting schemes, and/or other assets. The data storage is provided by one or more data storage devices and the example of FIG. 1 shows a data storage device 118 in the server environment 110 and the following description is made with reference to this device.

The data storage application 116 may, for example, be a relational database management application or an alternative application for storing and retrieving data from the data storage device 118. The data storage application 116 stores data to and retrieves data from one or more non transient (or persistent) data storage devices 118—e.g. non-transient computer readable storage devices such as hard disks, solid state drives, tape drives, or alternative computer readable storage devices.

In the server environment 110, the server application 114 persistently stores data to the data storage device 118 via the data storage application 116. In alternative implementations, however, the server application 114 may be configured to directly interact with the data storage device 118 to store and retrieve data, in which case a separate data storage application may not be needed. Furthermore, while a single data storage application 116 is described, the server environment 110 may include multiple data storage applications. For example one data storage application 116 may be used for user data, another for design data, and one or more further data storage applications 116 used for design element data. In this case, each data storage application may interface with one or more shared data storage devices 118 and/or one or more dedicated data storage devices 118, and each data storage application may receive/respond to requests from various server-side and/or client-side applications (including, for example server application 114).

As noted, the server application 114 and data storage application 116 run on (or are executed by) computer processing hardware 112. Computer processing hardware 112 includes one or more computer processing systems. The precise number and nature of those systems will depend on the architecture of the server environment 110.

For example, in one implementation a single server application 114 runs on its own computer processing system and a single data storage application 116 runs on a separate computer processing system. In another implementation, a single server application 114 and a single data storage application 116 run on a common computer processing system. In yet another implementation, server environment 110 may include multiple server applications running in parallel (on one or multiple computer processing systems).

Communication between the applications and computer processing systems of the server environment 110 may be by any appropriate means, for example direct communication or networked communication over one or more local area networks, wide area networks, and/or public networks (with a secure logical overlay, such as a VPN, if required).

The present disclosure describes various operations that are performed by applications of the server environment 110. Generally speaking, however, operations described as being performed by a particular application (e.g. server application 114) could be performed by one or more alternative applications, and/or operations described as being performed by multiple separate applications could in some instances be performed by a single application.

The client system 130 hosts the client application 132 which, when executed by the client system 130, configures the client system 132 to provide client-side functionality/ interact with sever environment 110 (or, more specifically, the server application 114 and/or other application provided by the server environment 110). Via the client application 132, a user can perform various operations such as creating, editing, saving, retrieving/accessing, publishing, and sharing documents including one or more designs. Such operations may be performed solely by the client application 132, or may involve the client application 132 communicating with the server environment 110 for processing to be performed there (e.g. by the server application 114). It will be appreciated that where the relevant operations are performed solely by the client application 132, then there may be no need for communication with or the presence of the server environment 110.

The client application 132 may be a general web browser application which accesses the server application 114 via an appropriate uniform resource locator (URL) and communicates with the server application 114 via general world-wide-web protocols (e.g. http, https, ftp). Alternatively, the client application 132 may be a native application programmed to communicate with server application 114 using defined application programming interface (API) calls.

A given client system such as 130 may have more than one client application 132 installed and executing thereon. For example, a client system 130 may have a (or multiple) general web browser application(s) and a native client application.

The techniques and operations described herein are performed by one or more computer processing systems.

By way of example, the client system 130 may be any computer processing system which is configured or is configurable by hardware and/or software to offer client-side functionality. A client system 130 may be a desktop computer, laptop computers, tablet computing device, mobile/smart phone, or other appropriate computer processing system. Similarly, the applications of the server environment 110 are also executed by one or more computer processing systems. Server environment computer processing systems will typically be server systems, though again may be any appropriate computer processing systems.

Figure 2:
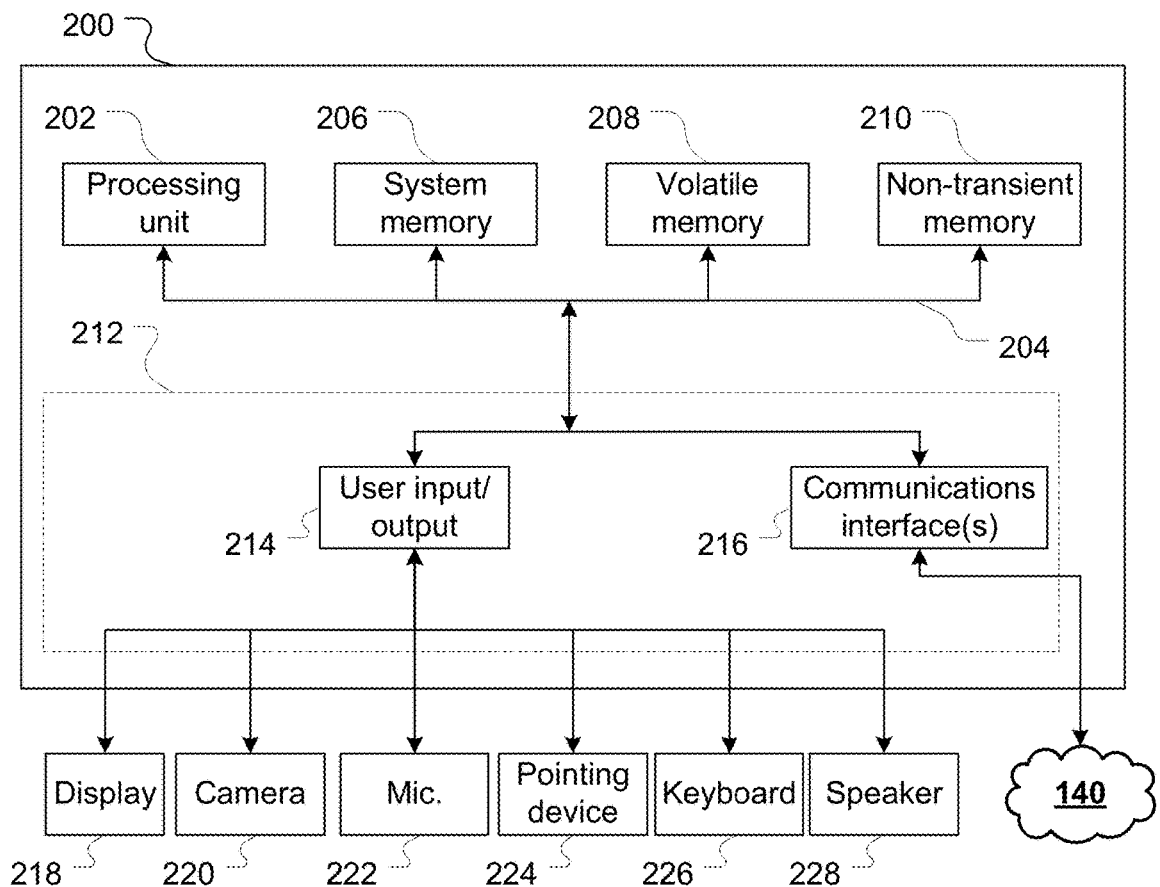
FIG. 2 is a block diagram of a computer processing system configurable to perform various features of the present disclosure.

FIG. 2 provides a block diagram of a computer processing system 200 configurable to implement embodiments and/or features described herein. The system 200 is a general purpose computer processing system. It will be appreciated that FIG. 2 does not illustrate all functional or physical components of a computer processing system. For example, no power supply or power supply interface has been depicted, however system 200 will either carry a power supply or be configured for connection to a power supply (or both). It will also be appreciated that the particular type of computer processing system will determine the appropriate hardware and architecture, and alternative computer processing systems suitable for implementing features of the present disclosure may have additional, alternative, or fewer components than those depicted.

The computer processing system 200 includes at least one processing unit 202. The processing unit 202 may be a single computer processing device (e.g. a central processing unit, graphics processing unit, or other computational device), or may include a plurality of computer processing devices. In some instances, where a computer processing system 200 is described as performing an operation or function all processing required to perform that operation or function will be performed by processing unit 202. In other instances, processing required to perform that operation or function may also be performed by remote processing devices accessible to and useable by (either in a shared or dedicated manner) system 200.

Through a communications bus 204 the processing unit 202 is in data communication with a one or more machine readable storage (memory) devices which store computer readable instructions and/or data which are executed by the processing unit 202 to control operation of the processing system 200. In this example the system 200 includes a system memory 206 (e.g. a BIOS), volatile memory 208 (e.g. random access memory such as one or more DRAM modules), and non-transient memory 210 (e.g. one or more hard disk or solid state drives).

The system 200 also includes one or more interfaces, indicated generally by 212, via which system 200 interfaces with various devices and/or networks. Generally speaking, other devices may be integral with the system 200, or may be separate. Where a device is separate from system 200, connection between the device and system 200 may be via wired or wireless hardware and communication protocols, and may be a direct or an indirect (e.g. networked) connection.

Wired connection with other devices/networks may be by any appropriate standard or proprietary hardware and connectivity protocols. For example, system 200 may be configured for wired connection with other devices/communications networks by one or more of: USB; eSATA; Ethernet; HDMI; and/or other wired connections.

Wireless connection with other devices/networks may similarly be by any appropriate standard or proprietary hardware and communications protocols. For example, the system 200 may be configured for wireless connection with other devices/communications networks using one or more of: BlueTooth; WiFi; near field communications (NFC); Global System for Mobile Communications (GSM), and/or other wireless connections.

Generally speaking, and depending on the particular system in question, devices to which the system 200 connects—whether by wired or wireless means—include one or more input devices to allow data to be input into/received by the system 200 and one or more output devices to allow data to be output by system 200. Example devices are described below, however it will be appreciated that not all computer processing systems will include all mentioned devices, and that additional and alternative devices to those mentioned may well be used.

For example, the system 200 may include or connect to one or more input devices by which information/data is input into (received by) the system 200. Such input devices may include keyboard, mouse, trackpad, microphone, accelerometer, proximity sensor, GPS, and/or other input devices. The system 200 may also include or connect to one or more output devices controlled by the system 200 to output information. Such output devices may include devices such as a display (e.g. a LCD, LED, touch screen, or other display device), speaker, vibration module, LEDs/other lights, and/or other output devices. The system 200 may also include or connect to devices which may act as both input and output devices, for example memory devices (hard drives, solid state drives, disk drives, and/or other memory devices) which the system 200 can read data from and/or write data to, and touch screen displays which can both display (output) data and receive touch signals (input).

By way of example, where the system 200 is the client system 130 it may include a display 218 (which may be a touch screen display), a camera device 220, a microphone device 222 (which may be integrated with the camera device), a pointing device 224 (e.g. a mouse, trackpad, or other pointing device), a keyboard 226, and a speaker device 228.

The system 200 also includes one or more communications interfaces 216 for communication with a network, such as network 140 of environment 100 (and/or a local network within the server environment 110). Via the communications interface(s) 216, system 200 can communicate data to and receive data from networked systems and/or devices.

The system 200 may be any suitable computer processing system, for example, a server computer system, a desktop computer, a laptop computer, a netbook computer, a tablet computing device, a mobile/smart phone, a personal digital assistant, or an alternative computer processing system.

The system 200 stores or has access to computer applications (also referred to as software or programs)—i.e. computer readable instructions and data which, when executed by the processing unit 202, configure the system 200 to receive, process, and output data. Instructions and data can be stored on non-transient memory 210. Instructions and data may be transmitted to/received by the system 200 via a data signal in a transmission channel enabled (for example) by a wired or wireless network connection over an interface, such as communications interface 216.

Typically, one application accessible to system 200 will be an operating system application. In addition, system 200 will store or have access to applications which, when executed by the processing unit 202, configure system 200 to perform various computer-implemented processing operations described herein. For example, and referring to the networked environment of FIG. 1 above, server environment 110 includes one or more systems which run a server application 114, a data storage application 116. Similarly, client system 130 runs a client application 132.

In some cases part or all of a given computer-implemented method will be performed by the system 200 itself, while in other cases processing may be performed by other devices in data communication with system 200.

Figure 3:
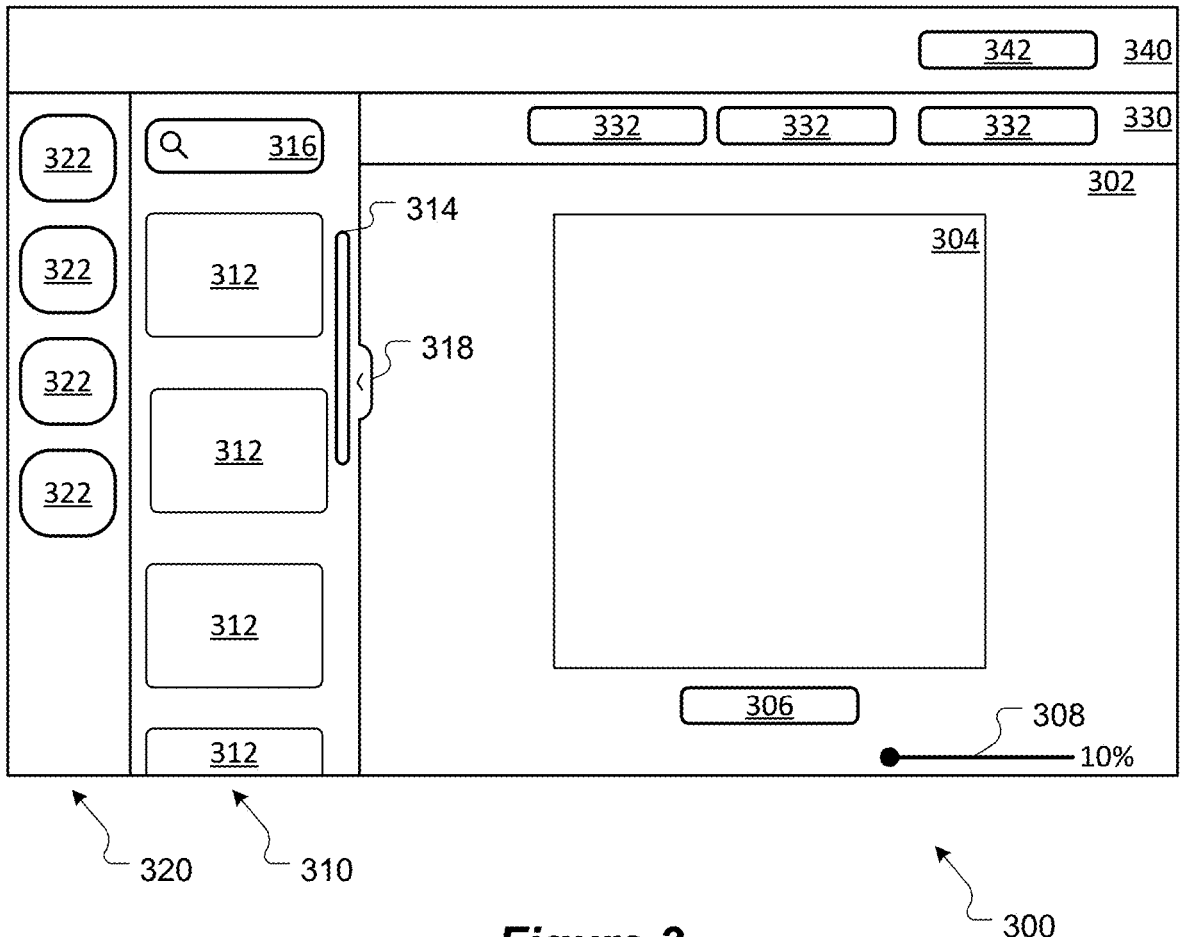
FIG. 3 depicts an example design creation graphical user interface.

The client application 132 configures the client system to provide a design creation user interface. Generally speaking, a design creation user interface (UI) will allow a user to create, edit, and output designs. To illustrate the types of features that client application 132 may provide, FIG. 3 provides one example of a design creation user interface, which example is in the form of a graphical user interface (GUI) 300. Alternative interfaces, with alternative layouts and/or providing alternative tools and functions, are possible.

The GUI 300 includes a design preview area 302 in which a canvas 304 is shown. The canvas 304 is used to display a page of a design that is being worked with (e.g. created, edited, output). In particular, the design will consist or include one or more tables (not shown in FIG. 3). In this example, an add page control 306 is provided, which if activated by a user, causes a new page to be added to the design being created. A zoom control 308 is also provided, by which a user can interact with to zoom into/out of the page currently displayed by the canvas 304.

The GUI 300 also includes an asset preview area 310. The asset preview area 310 displays previews 312 of assets that are made available (e.g. by server environment 110) to users to assist in creating designs. Example assets that may be available for selection from the asset preview area 310 are tables with a selection of available default table formats. For instance, one preview 312 may be a preview of a table in which all cells are formatted the same and another may preview a table format in which the first/uppermost row of the table has one format consistent with column headings and the other rows have a second format, consistent with column entries. Another example asset that may be available for selection from the asset preview area 310 are charts. For instance, one preview 312 may be a preview of a pie chart, another a preview of a bar chart and a third a preview of a line graph. In some embodiments a chart is generated by a combination of a user selecting a table and selecting a preview of the type of chart the user requires.

In this example, the preview area 310 displays a scroll control 314 allowing a user to scroll through previews 312. Scroll control 314 may be hidden when user focus is not in the preview area 310. Preview area 310 also includes a search control 316 via which a user can submit search data (e.g. a string of characters) to search for particular design assets. Previews 312 of the search results returned are then displayed in the preview area 310. In this example, a hide preview area control 318 is provided which can be activated to hide the asset preview area 310 (serving to enlarge the design preview area 302).

The GUI 300 also includes a type selection area 320, which displays a plurality of type selection controls 322. The type selection controls 322 may be activated by a user to select a type of design asset for which previews 312 are displayed (and can be searched for) in asset preview area 310. By way of example, type selection controls 322 may be provided for types such as design templates, design elements, photos (e.g. raster graphics), graphics (e.g. vector graphics), text, audio, video, styles, and/or other types. The previews of tables (and in some embodiments the previews of charts) may be displayed responsive to selection of a selection control 322 for design elements.

The GUI 300 also includes an adaptive control area 330 for displaying adaptive controls 332. Adaptive controls 332 change depending on the type of design element that is currently selected/being interacted with by a user. For example, if a text element is selected adaptive controls 332 such as font style, type, size, position/justification, and/or other font related controls may be displayed. Alternatively, if a table graphic element is selected, adaptive controls 332 such as fill, line style, line width, transparency, delete column, delete row, add column, add row, move column, move row, size column, size row and/or other table graphic related controls may be displayed. An adaptive control 332 may be a menu, which when selected displays a menu of controls. In other embodiments, one or more controls relating to a table are not adaptive controls and are instead displayed on user command or always displayed as part of the GUI 300.

The GUI 300 also includes an additional control area 340 which displays additional controls 342. Any appropriate additional controls 342 may be displayed, for example controls to save, download, print, share, resize, and/or perform other actions.

Once created, a user may output a design in various ways. For example, client application 132 may provide a user with options to output a design by one or more of: saving the design to local memory of client system 130 (e.g. non-transient memory 210); saving the design to the data storage device 118 of server environment 110; printing the design to a printer (local or networked); communicating the design to another user (e.g. by email, instant message, or other electronic communication channel); publishing the design to a social media platform or other service (e.g. by sending the design to a third party server system with appropriate API commands to publish the design); and/or by other output means.

Figure 4:
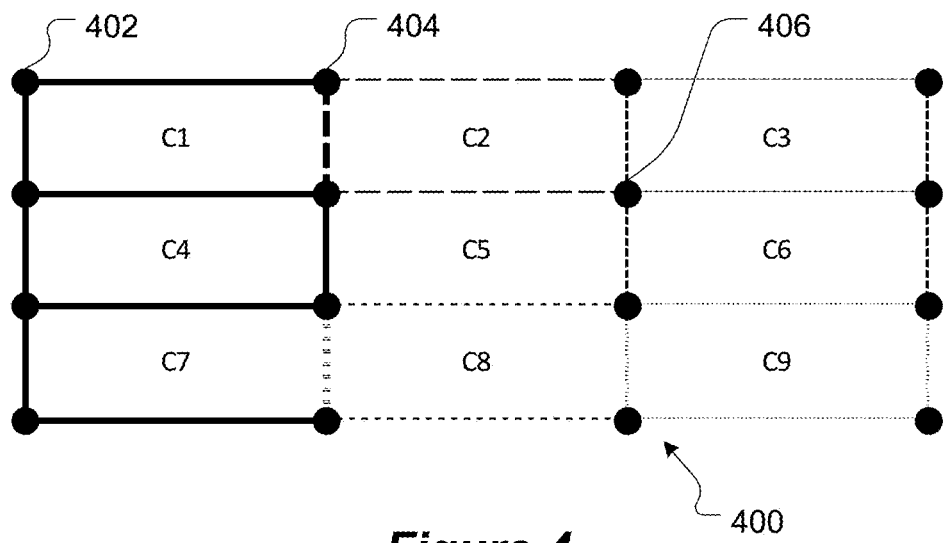
FIG. 4 depicts an example table.

FIG. 4 shows an example table 400. The table 400 includes nine cells C1-C9. Each cell C1-C9 has four borders, a left border, a right border, a top border and a bottom border.

The borders between two cells are called herein interior borders and the borders that are around the outside of the table are called herein the peripheral borders.

Each border has a plurality of attributes, each of which has a plurality of possible attribute values available for use for that border. A user may set or change the value of the attributes, using a design creation UI, for example the GUI 300. The values of the attributes may be selected using a control of the user interface, for example an adaptive control 332 of the GUI 300.

An example attribute is the line width of the border, wherein the value of the attribute is the width of the line. In the example of FIG. 4 all four borders of cells C1, C4 and C7 have a first line width, for example a line width of 3 points, whereas all four borders of cells C3, C6 and C9 have a second line width, different to the first line width, for example a line width of 1.5 points. The right border of each of cells C2, C5 and C8 has the second line width and the other borders have the first line width. In FIG. 4 the width of the line depicting a border represents the line width of that border.

Another example of an attribute is the colour of the border, wherein the value of the attribute specifies the colour. In FIG. 4 differences in line style represent differences in colour. For example, a solid line may represent a blue colour, a dashed line may represent a red colour and a dotted line may represent a yellow colour. For the purposes of this disclosure, white, black and grey are treated as colours.

It will be appreciated that another example of another attribute is line style, wherein the value of the attribute specifies the line style. Example line styles are solid lines, dashed lines, dotted lines, single lines, double lines, two lines of variable width, no line (which may be viewed as a line of zero width) and so forth. As mentioned above, line style is used in FIG. 4 to depict differences in colour. For simplicity of explanation, it is assumed that all border lines of FIG. 4 have the same line style, for example all solid lines.

Other border attributes may include tone or transparency. Still further or alternative attributes for a particular system may be defined and able to be selected and controlled for a table by a user.

A user may use the design creation UI to set or change the value of one or more attributes of a border via a range of methods. These methods include options for directly or indirectly selecting the borders to which the attribute value is to be applied. For example, a user may individually select one or more cell borders, select an entire cell or select a range of cells. When selecting a cell, the user may indicate that all four borders of that cell are selected. Alternatively, only a subset of the borders may be selected, for example by selecting a column of cells and selecting the left edge of the column. The user may then select a value for an attribute for the selected borders.

Each intersection of borders in the table 400 is represented in FIG. 4 by a solid circle. While a table may be rendered with nodes in the shape of a circle or otherwise, it will be appreciated that many tables are rendered without nodes. There are two borders at the intersections at the four vertices of the table, for example intersection 402. There are three borders at the intersections along the sides of the table, for example intersection 404. There are four borders at the interior intersections, for example intersection 406. The four borders of those adjacent cells that extend to/from the intersection may have different attribute values. For example, there may be up to four different line weights, up to four different colours and up to four different line styles.

One problem that is faced by the developers of applications for design creation is how to render the intersections of borders, when the borders extending from the intersection have attribute values set or changed to have between two to four different attribute values. For example while the intersection 402 may be rendered as a continuous line, due to the borders at the intersection having the same attributes, the borders at intersections 404 and 406 have different attributes.

Figure 5A:
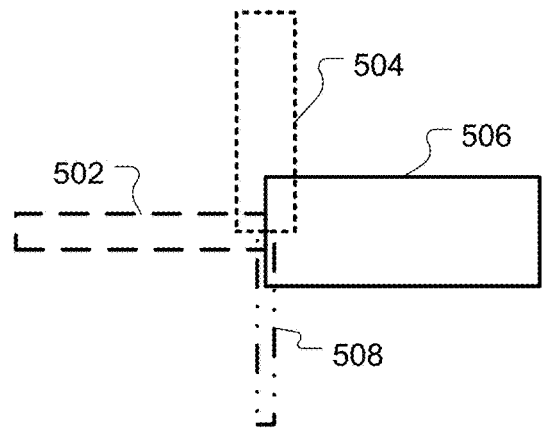
FIGS. 5A and 5B each show an example table intersection.

FIG. 5A shows an intersection formed by four lines 502, 504, 506 and 508, with each line terminating at the centre of the intersection. For clarity of illustration only the outline of each line 502, 504, 506 and 508 is shown and the outline is in different line styles (dashes, dots, dot-dashes or solid), to assist in distinguishing each line. Having each line terminating at the centre of the intersection may be viewed as an aesthetically inferior option for rendering the intersection, for example due to having some (e.g. lower layer) borders that are partially visible and partially obscured by other (e.g. higher layer) borders. If line 506 of FIG. 5A was the highest layer line, then line 508 will have a very narrow section visible up the left end of line 506 and line 504 will have an inverted L-shaped end.

Figure 5B:
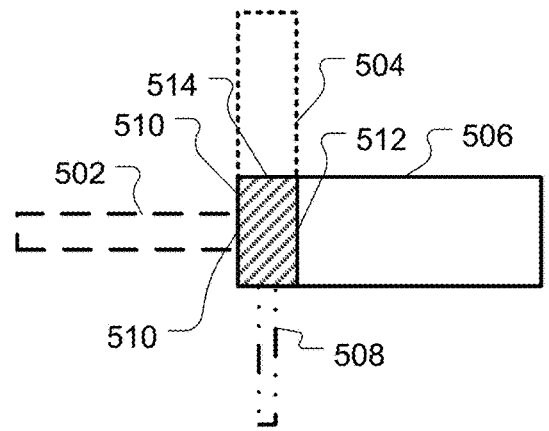

FIG. 5B shows the same four lines 502, 504, 506 and 508 and an overlaid join box 510. The join box 510 has a width that is equal to the weight of the thickest vertical line, which in this example is line 504 and has a height that is equal to the weight of the thickest horizontal line, which in this example is line 506. An option is to apply an attribute from one of the lines over the area of the join box.

In other embodiments, the area of the join box for an intersection may be defined with reference to other lines, which may not be the thickest lines at the intersection. However, it is anticipated that these embodiments may be viewed as less aesthetically pleasing. The remainder of this description assumes that the join box are is defined by the combination of the thickest vertical line and the thickest horizontal line.

In still other embodiments, the interior intersections of the table or the interior and exterior intersections of the table may be represented by a node, for example a circular node so that the table has an appearance like that of FIG. 4. The size of the node may be set based on the size of the thickest lines in the table. The nodes may all be same size or may vary between nodes, for example depending on the border widths at the intersection. A rendering option for the table is to apply to the area of the node an attribute value or set of two or more attribute values to match one of the lines or which is selected based on the attribute values of one of the lines. For example, the node may be set to the same colour as one of the lines at the intersection or to the same colour and transparency as one of the lines.

In embodiments that use a join box or node approach to rendering a table, a problem arises of how the application is to determine what values of line attribute or attributes to use when rendering the join box or node. The following description is with reference to tables with join boxes. Selection of attribute values for a node may use the same techniques.

One set of solutions to this problem when the lines have varying line weight, for example as shown in FIG. 5B, is to apply the attribute values of one of the two thickest lines that defined the area of the join box. In the example of FIG. 5B the attributes of the join box may be set to the same values as the values of the attributes of line 506 or alternatively set with attribute values to match line 504. It will be appreciated that using this approach the table is rendered with an appearance that either line 506 or line 504 extend through the intersection, across the extent of the join box.

An example solution based on line weight is for the application to render the join box with attribute values that match the thickest line. Another example solution based on line weight is for the application to render the join box with attribute values that match the thickest horizontal line. Another example solution is for the application to render the join box with attribute values that match the thickest vertical line. In other examples the application renders the join box based on a plurality of conditions. For instance, another example solution is rendering the join box based on the thickest horizontal line, unless the thickest vertical line is greater in weight than the thickest horizontal line by more than a predefined amount. That predefined amount may be defined in different ways in different embodiments. Examples include a number of points, for example three points, a percentage amount or a combination of the two.

Referring to the example of rendering the join box with attribute values that match the thickest line, the application may, for example, determine the area of the join box, determine the thickest line entering the intersection and apply to the join box the attribute values of the determined thickest line entering the intersection. In another example, the application may determine the thickest line at the intersection, place that line as the highest layer of the lines entering the intersection and extend that line across the intersection so as to terminate at the distal edge of the thickest perpendicular line at the intersection.

Figure 6:
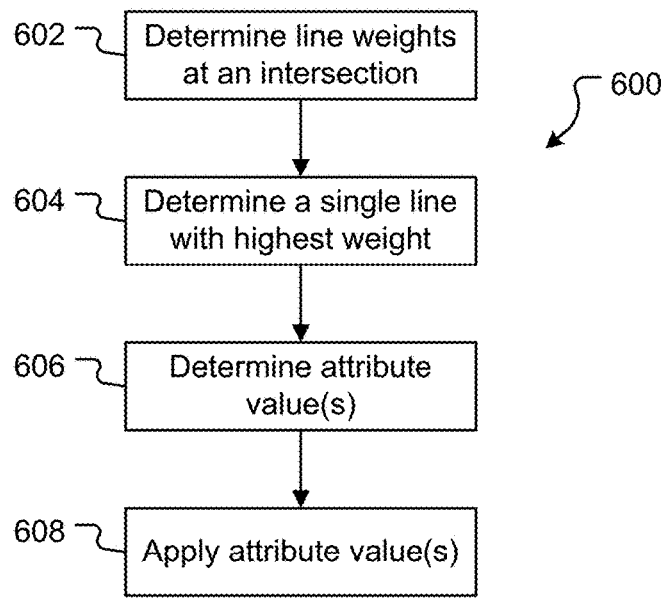
FIGS. 6 to 8 show flow diagrams of processes that may be performed by a computer processing system, for example by the computer processing system of FIG. 2.

FIG. 6 shows a flow diagram of a process for an application to determine attribute value(s) for a join box (or node) of an intersection. The particular example determination based on line weight illustrated in FIG. 6 is to select the thickest line at the intersection. The example commences at step 602 with a determination of line weight, or in other words a determination of line weight, for each line at the intersection. Step 602 may involve the application reading the attribute values for line weight for each line from memory.

In step 604 a determination is made that a single line at the intersection has the highest weight. The determination may be by a compare operation of the line weights read in step 602.

In step 606 the attribute value or values of the determined single line are determined. In some embodiments the attribute value or values are those defining a fill of the determined single line. The fill of a line may be defined by a colour value. The fill of a line may also be defined by a transparency value. The fill of a line may also be defined by other values, for example contrast, tone, pattern and so forth. In some embodiments the attribute value or values are those defining both the fill and the characteristics of an outline of the determined single line. The attribute values for the outline of a line may include whether or not there is a line or more than one line, the colour of the line and the pattern of the line.

Step 606 may include determining all attribute values required for the junction box to have the same appearance as the determined single line. In other embodiments step 606 may include determining some of the attribute values for the determined single line, so that only a subset of the attributes of the determined single line are applied to the junction box. For example, in some embodiments the table may render the junction boxes without transparency, regardless of whether or not the determined single line has transparency.

In step 608 the determined attribute value(s) from step 606 are applied to the junction box. In some embodiments in which the determined attribute values include values for the outline of the determined single line, the portions of the junction box that do not intersect with a line at the junction are rendered with a line having those attribute values. An example portion is a portion 510 shown in FIG. 5B. The portions that intersect with a line at the junction, for example portions 512, 514 may be rendered without a line. Alternatively, the portion joining the determined single line, which would be portion 512 of FIG. 5B may be rendered without a line and the remainder of the junction box rendered with a line. It will be appreciated that this rendering is equivalent to extending the determined single line across the junction box.

The solution to the problem of how the application is to determine what attribute value or attribute values to use when rendering the join box should address what occurs when there are two or more equal weight lines that are the thickest lines at the intersection. If the attribute values of all of those lines are the same, then the area of the join box can adopt those same attribute values. If the attribute values of two or more of those lines differ, the application is configured to match the attributes of the join box to one or more attributes of one of those lines.

Figure 7:
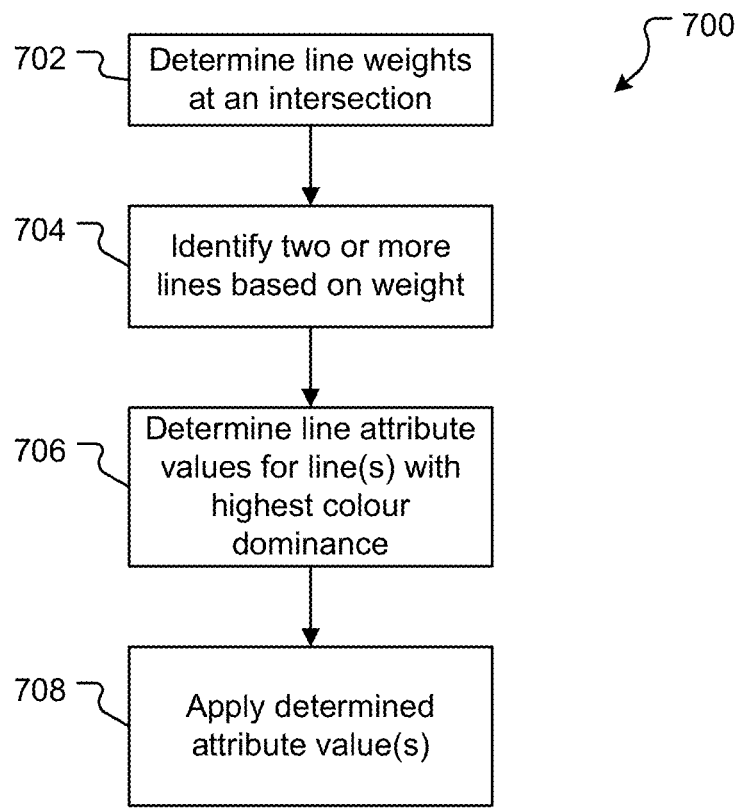

FIG. 7 shows a flow diagram of a process for an application to determine attribute value(s) for a join box (or node) of an intersection. The example commences at step 702 with a determination of line weight, or in other words a determination of line weight, for each line at the intersection. Step 702 may involve the application reading the attribute values for line weight for each line from memory.

In step 704 two or more lines, up to all of the lines, at the intersection are identified as having the same priority or dominance for affecting the attribute values of the junction box, based on line weight. The determination may be by a compare operation of the line weights read in step 702. For example, where the determination based on line weight is to select the thickest line at the intersection, there may be two or more lines at the intersection with equal weight that are the thickest lines at the intersection. As described above, in other alternatives another selection based on line weight may be made and those alternatives may result in two lines having the same priority or dominance.

In step 706 the attribute value or values of a determined single line or set of lines are determined. The determined attribute values may include the fill and/or outline characteristics, as described with reference to step 606 of FIG. 6. Where the identified two or more lines have the same attribute values, then those values are determined in step 706. Where the identified two or more lines have different attribute values, then step 706 includes determining the line or lines with the highest colour dominance at the intersection.

Colour dominance at an intersection is determined by a colour matching process of the lines at the intersection. If a line at the intersection matches in colour to another line at the intersection, it has a higher dominance in comparison to a line that does not match in colour with any other line at the intersection. Similarly a line that matches in colour to two lines has a higher dominance than a line that matches in colour to a single line.

In some embodiments the matching process determines when the colour attribute values are the same. In some embodiments this is independent of other attributes, such as transparency, so that two lines of the same colour but different transparency are determined as a match. In other embodiments only lines that have the same colour attribute value and the same values for one or more, up to all, of the other attributes of the line are determined as a match for the purposes of determining colour dominance.

In some embodiments, colour attribute values are determined to match when they are within a predetermined amount of each other. For instance different shades of red may be determined as matching, up to a threshold difference, so that red and pink or red and purple are not determined as matching. In these embodiments, a look-up table of matching colours may be used by the application to determine whether there is a match between different colours.

In step 708 the determined attribute value(s) from step 706 are applied to the junction box. Step 708 may involve the same processes as step 608 of FIG. 6. A description of this process and its options is therefore not repeated. Step 708 may include an additional process based on the colour matching process. For example if two lines of different colour were determined to be a match, then the application may change the colour attribute of the lines to be the same value. In another example, if two lines of the same or different colour were determined to be a match, but have one or more different other attributes, such as transparency, the application may change the one or more other attribute values of the lines to be the same value. The application may present a prompt or suggestion to a user prior to making these changes, with the changes being made dependent on or responsive to the user indicating acceptance of the change. The suggested or prompted change may be to match the lesser weight line to the greater weight line, or if the lines are equal weight to match a line at a certain position at the intersection (e.g. a horizontal line or the left horizontal line if both are horizontal).

The solution to the problem of how the application is to determine what attribute value or attribute values to use when rendering the join box should also address what occurs when there are two or more equal weight lines that are the thickest lines at the intersection, which have equal colour dominance and which have one or more different attribute values. Various options may be provided in different embodiments. One option is to provide a prompt to user of the system to select the attribute values to use, for example by selecting one of the two or more lines of equal dominance following the weight and colour determinations described above.

Another option to address equal colour dominance between two or more lines at an intersection is to determine which of the lines has positional dominance. The determination of positional dominance is based at least in part on the position of the line at the intersection. For ease of description, the positions are described herein as left, right, top and bottom. Referring to FIG. 5A the left line is line 502, the right is line 506, the top is line 504 and the bottom is line 508.

In one embodiment, the determination of positional dominance determines that the left line has the highest priority, the right the second highest priority, the bottom the third highest priority and the top the lowest priority. In other embodiments the order is different. For example in other embodiments the right line may have the highest priority and the left the second highest priority, thereby still prioritising horizontal lines, and the vertical lines may be prioritised in either order.

In some embodiments, the determination of positional dominance is also based on variables other than position at the intersection. For example, in some embodiments positional dominance is determined based on line weight.

In some embodiments the determination of positional dominance allows for two lines to be determined to be of equal highest dominance. In these embodiments the junction box may be split into portions, for example a 50:50 split, with the attribute(s) of one the highest dominance lines applied to one portion and the attributes of another of the highest dominance lines applied to another portion. For example, if both the left and the right lines have equal weight and colour dominance, then the junction box may be split horizontally into two equal portions, with the attribute values of the left portion of the junction box set to the attribute values of the left line and the attribute values of the right portion of the junction box set to the attribute values of the right line. A similar approach may be adopted for top and bottom lines of equal weight and colour dominance.

Figure 8:
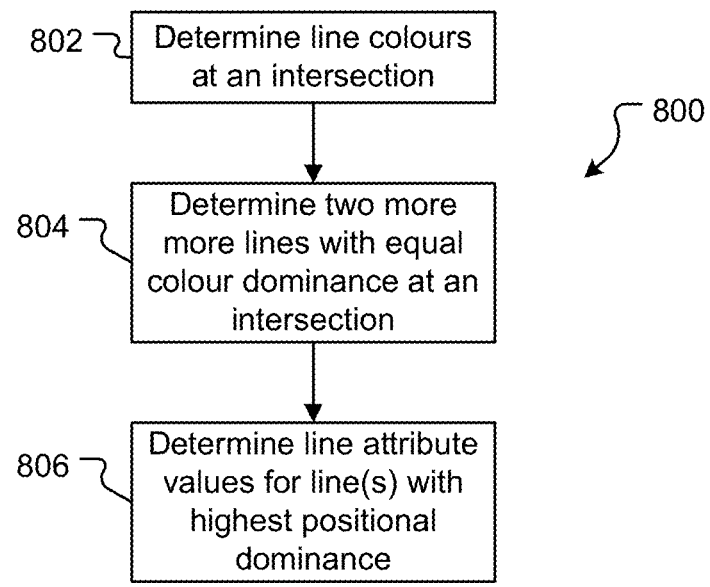

FIG. 8 shows an example of a process to determine positional dominance. In some embodiments the process of FIG. 8 may be performed to implement step 706 of FIG. 7.

The example commences at step 802 with a determination of line colour. The determination off line colour may be for or at least include each of the lines identified in step 704. Step 802 may involve the application reading the attribute values for line colour for each line from memory.

In step 804 two or more lines at the intersection are identified as having the same colour dominance at the intersection. For example, two equal thickest lines at an intersection may both have no matching colour (as per step 706) with the other two lines at the intersection. In another example, two equal thickest lines at an intersection may both matching the colour of one other line at the intersection.

In step 806 the line or lines with positional dominance are determined. In one embodiment the determination involves finding the first match in the following ordered list:

a) Two colour groups of lines tied on thickness and colour dominance and which join at right angles. In this instance use a tie-breaking rule. An example tie-breaking rule is to use the attribute value(s), e.g. colour, of the two options that are rarest across the entire table.

b) Both the left and the right lines are equal highest in weight and colour dominance. In this instance they are treated as equal in positional dominance and the junction box is split, for example by a horizontal split, which may be 50:50.

c) The left line, if it is one of the lines identified in step 804.

d) The right line, if it is one of the lines identified in step 804.

e) Both the top and the bottom lines are equal highest in weight and color dominance. In this instance they are treated as equal in positional dominance and the junction box is split, for example by a vertical split, which may be 50:50.

f) The bottom line, if it is one of the lines identified in step 804.

g) The top line.

Other tie-breaking rules for item a) may be used. One example is to use the attribute value(s) that provide the highest (or lowest) contrast with the surrounding design. Another example is to specify the left line (or another of the lines) as dominant.

In other embodiments, the order of the lines referred to in items c) and d) are swapped in the ordered list and/or the order of the lines referred to in items f) and g) are swapped in the ordered list and/or the order of the lines referred to in items b) and e) are swapped in the ordered list and/or item e) in the ordered list is moved to immediately before or after item b). Other variations are also possible, for example by omitting item a) from the ordered list.

Step 806 may complete step 706 of FIG. 7 and step 708 from FIG. 7 may therefore be performed next.

In some embodiments the application includes configurable options that affect the rendering of a table. Each different configurable option may match a different embodiment described above. For example, the application may include one option that determines that the dominant line based on weight is the thickest at the intersection and another option that determines that the dominant line based on weight is the thickest horizontal line and/or another option that determines that the dominant line is the thickest vertical line. In some embodiments another configurable option includes the colour difference threshold as described in relation to step 706. In some embodiments another configuration option includes whether to use junction box areas or nodes at the intersection. Another configuration option is the size and/or shape of the nodes.

While the foregoing description has placed weight dominance as a higher priority to colour dominance for determining the attribute values of a join box or node, in other embodiments colour dominance has a higher priority to weight dominance. In embodiments in which colour dominance has a higher priority to weight dominance, positional dominance may still be used as a third priority, as described herein above. The processes described with reference to FIGS. 6 to 8 may be followed, except that the processes for determining weight dominance are replaced by the processes for determining colour dominance and the processes for determining colour dominance are replaced by the processes for determining weight dominance.

FIGS. 9 to 12 show various examples of intersections. Unless otherwise stated, the following description of these examples describes how an application may render the intersection in a table, based on line weight, colour dominance and positional dominance, in that order.

More particularly, the following description describes from which line or lines attribute values are taken for the area of a join box or node at the intersection. An application may render an intersection according to all or any subset of the examples described with reference to FIGS. 9 to 12. Each subset is incorporated herein as if individually described.

Figure 9:
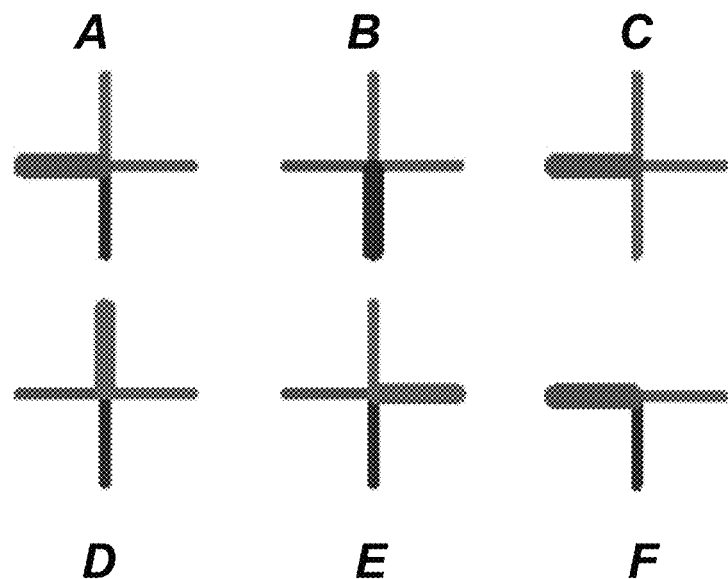
FIGS. 9 to 12 are examples of table intersections.

The example intersections of FIGS. 9 to 12 are formed by four lines, with the exception of example F in FIG. 9. Each line has a colour. In the example one of four different colours is used for each line. It will be appreciated that less or more different colours may be present in a given table or across two or more tables in a design document. Table 1 summarises the colours of each intersection. By way of example, colour 1 may be purple, colour 2 may be red, colour 3 may be blue and colour 4 may be green. In other examples the different colours may include different shades of the same colour, for example light red and dark red.

TABLE 1

| Intersection | Left line colour | Upper line colour | Right line colour | Lower line colour | Join box or node colour |
|---|---|---|---|---|---|
| 9-A | 1 | 2 | 3 | 4 | 1 |
| 9-B | 1 | 2 | 3 | 4 | 4 |
| 9-C | 1 | 2 | 2 | 2 | 1 |
| 9-D | 1 | 2 | 3 | 4 | 2 |
| 9-E | 1 | 2 | 3 | 4 | 3 |
| 9-F | 1 | NA | 3 | 4 | 1 |
| 10-A | 1 | 2 | 3 | 4 | 1 |
| 10-B | 1 | 2 | 3 | 4 | 1 |
| 10-C | 1 | 2 | 1 | 4 | 1 |

TABLE 1-continued

| Intersection | Left line colour | Upper line colour | Right line colour | Lower line colour | Join box or node colour |
|---|---|---|---|---|---|
| 10-D | 1 | 2 | 3 | 4 | 2 and 4 |
| 10-E | 1 | 2 | 3 | 4 | 1 and 3 |
| 10-F | 1 | 1 | 3 | 1 | 1 |
| 10-G | 1 | 2 | 4 | 4 | 4 |
| 11-A1 | 1 | 2 | 3 | 4 | 1 |
| 11-B | 1 | 2 | 3 | 4 | 1 and 3 |
| 11-A2 | 1 | 2 | 3 | 4 | 2 and 4 |
| 11-C | 1 | 2 | 1 | 4 | 1 |
| 11-D | 1 | 1 | 3 | 4 | 1 |
| 11-E | 1 | 2 | 2 | 4 | 2 |
| 12-A | 1 | 2 | 3 | 4 | 1 and 3 |
| 12-B | 1 | 1 | 3 | 4 | 1 |
| 12-C | 1 | 2 | 1 | 4 | 1 |
| 12-D | 1 | 1 | 1 | 4 | 1 |
| 12-E | 1 | 2 | 1 | 1 | 1 |
| 12-F | 1 | 1 | 1 | 1 | 1 |
| 12-G | 1 | 2 | 1 | 2 | 1 |
| 12-H | 2 | 2 | 3 | 3 | 2 |
| 12-I | 2 | 2 | 3 | 3 | 3 |

FIG. 9 shows six examples, A to F, of intersections with one line having weight dominance. In each of these instances, the application renders the intersection using attribute values from the line with weight dominance.

Figure 10:
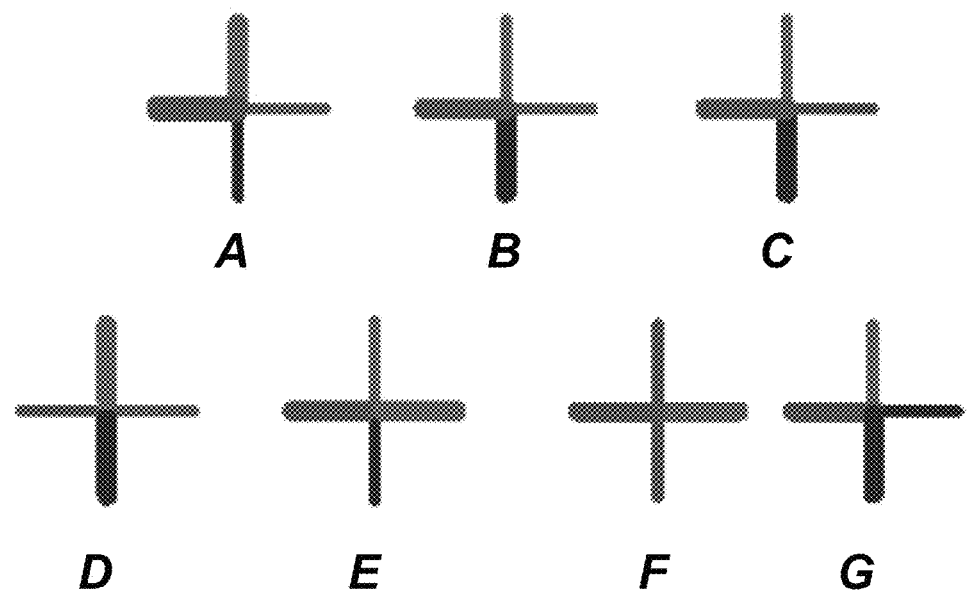

FIG. 10 shows seven examples, A to G, of intersections with two lines having weight dominance. Examples C, F and G each include a single line with colour dominance and therefore the join box or node attributes are selected with reference to the colour dominant line. Examples A, B, D and E have no colour dominant line. Examples D and E show top and bottom, and left and right lines of equal weight and colour dominance, so that the junction box or node is split. Examples A and B shows that the horizontal line has a higher positional dominance than a vertical line.

Figure 11:
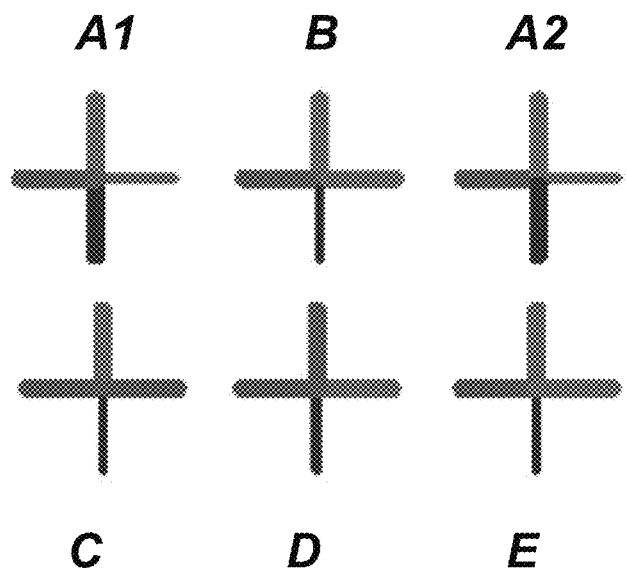

FIG. 11 shows six examples, A1, A2 and B to E, of intersections with three lines having weight dominance. Examples C, D and E each have a colour dominant line. In example B both the left and the right lines are equal highest in weight and colour dominance and they are treated as equal in positional dominance, with a resulting junction box or node horizontal split. Example A1 is an embodiment in which the left line is given higher positional dominance over two vertical lines of the same weight, whereas example A2 is an embodiment in which two vertical lines of the same weight are given higher positional dominance over the left line.

Figure 12:
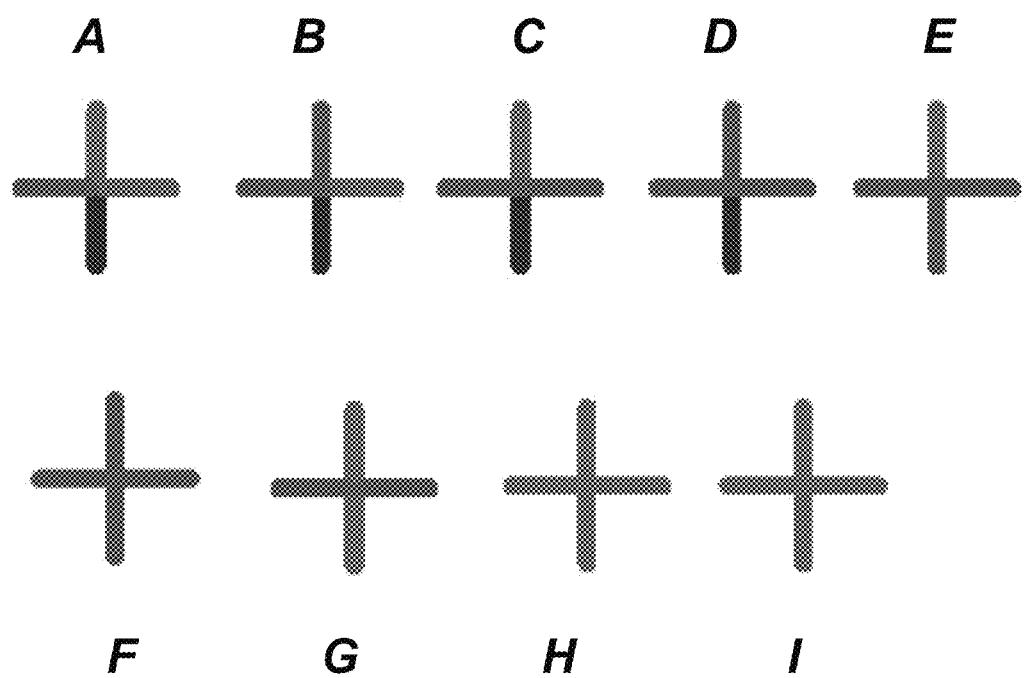

FIG. 12 shows nine examples, A to I, of intersections with no line having weight dominance. Examples B, C, D, E, F and G are examples in which the colour dominant lines are identified and the attributes of these lines are used for the join box or node. Example A is an example in both the left and the right lines equal highest in weight and colour dominance and therefore the junction box or node is split horizontally, for example according to positional dominance rules in the previously described ordered list of items a) to g). Examples H and I are examples of two L-shaped intersections, with two colour groups of lines tied on thickness and colour dominance and which join at right angles. Each is from a table with a different minority colour in the table, as per item a) of the previously described ordered list. If there is no minority colour, then a further tie-break rule may be utilised, for example using the attribute values of the innermost line, where the innermost line is the left-most line for reading left to right and the right-most line for reading right to left.

In the above embodiments the operations may be performed by the client system 130 (e.g. under control of the client application 132). Variations are, however, possible. For example in certain cases an operation performed by client system 130 may be performed instead at the server environment 110. Generally speaking, however, where user input is required such user input is initially received at client system 130 (by an input device thereof). The user input (or data representative of that input) may be processed by one or more applications running on client system 130 or may be communicated to server environment 110 for one or more applications running on the server hardware 112 to process. Similarly, data or information that is to be output by a client system 130 (e.g. via display, speaker, or other output device) will ultimately involve that system 130. The data/information that is output may, however, be generated (or based on data generated) by client application 132 and/or the server environment 110 (and communicated to the client system 130 to be output).

Furthermore, in certain implementations a computer processing system 200 may be configured (by an application running thereon) to perform the processing described herein entirely independently of a server environment 110. In this case, the application running on that system is a stand-alone application and all instructions and data required to perform the operations described above are stored on that computer processing system 200 (or devices connected thereto).

The flowcharts illustrated in the figures and described above defines operations in a particular order to explain various features. In some cases the operations described and illustrated may be able to be performed in a different order to that shown/described, one or more operations may be combined into a single operation, a single operation may be divided into multiple separate operations, and/or the function(s) achieved by one or more of the described/illustrated operations may be achieved by one or more alternative operations.

It will be understood that the embodiments disclosed and defined in this specification extend to alternative combinations of two or more of the individual features mentioned in or evident from the text or drawings. All of these different combinations constitute alternative embodiments of the present disclosure.

The present specification describes various embodiments with reference to numerous specific details that may vary from implementation to implementation. No limitation, element, property, feature, advantage or attribute that is not expressly recited in a claim should be considered as a required or essential feature. Accordingly, the specification and drawings are to be regarded in an illustrative rather than a restrictive sense.

The invention claimed is:

1. A computer implemented method for rendering a table, the method comprising:
for at least one intersection formed by a plurality of lines of a table, each of the plurality of lines associated with at least a first attribute, wherein a value of the first attribute defines an aspect of appearance of the line when the table is rendered on a display device:
matching a value of the first attribute of a first line of the plurality of lines with a value of the first attribute for at least a second line of the plurality lines, wherein the second line is different to the first line;
based on the matching, rendering a displayed area of the intersection with a value for the first attribute that matches the value of the first attribute of the first line; and
matching a value of the first attribute of a third line of the plurality of lines with at least a value of the first attribute for a fourth line of the plurality lines, wherein the first, second, third and fourth lines are different lines;
wherein the rendering with the value for the first attribute that matches the value of the first attribute of the first line is based on the first line having a higher positional dominance than the third line and the fourth line.

2. The computer implemented method of claim 1, wherein the first attribute is a colour attribute and the determined value for each of the plurality of lines specifies a colour for the line.

3. The computer implemented method of claim 1, wherein the displayed area of the intersection covers a centre of the intersection and extends by a non-zero distance from the centre in the direction of each of the plurality of lines.

4. The computer implemented method of claim 1, wherein the value of the first attribute of the first line is different to the value of the first attribute for the second line.

5. The computer implemented method of claim 1, wherein the at least one intersection is an intersection that has been determined to be formed by a plurality of lines of equal weight, which lines are the lines of the intersection with a highest weight.

6. The computer implemented method of claim 5, wherein the displayed area of the intersection is defined by an area of cross-over of the plurality of lines of equal weight.

7. The computer implemented method of claim 1, wherein the displayed area of the intersection is a node that encompasses an area of cross-over of the plurality of lines.

8. The computer implemented method of claim 1, further comprising rendering the displayed area of the intersection with a value for a second attribute that matches a value of the second attribute of the first line.

9. The computer implemented method of claim 8, wherein a value of the second attribute defines another an aspect of appearance of the line when the table is rendered on a display device.

10. A computer processing system comprising:
a processing unit;
a display; and
a non-transient computer-readable storage medium storing instructions, which when executed by the processing unit, cause the processing unit to perform a method for rendering a table, the method comprising:
for at least one intersection formed by a plurality of lines of a table, each of the plurality of lines associated with at least a first attribute, wherein a value of the first attribute defines an aspect of appearance of the line when the table is rendered on a display device:
matching a value of the first attribute of a first line of the plurality of lines with a value of the first attribute for at least a second line of the plurality lines, wherein the second line is different to the first line;
based on the matching, rendering a displayed area of the intersection with a value for the first attribute that matches the value of the first attribute of the first line, wherein the rendering is on the display; and
matching a value of the first attribute of a third line of the plurality of lines with at least a value of the first attribute for a fourth line of the plurality lines, wherein the first, second, third and fourth lines are different lines;
wherein the rendering with the value for the first attribute that matches the value of the first attribute of the first line is based on the first line having a higher positional dominance than the third line and the fourth line.

11. The computer processing system of claim 10, wherein the first attribute is a colour attribute and the determined value for each of the plurality of lines specifies a colour for the line.

12. The computer processing system of claim 10, wherein the displayed area of the intersection covers a centre of the intersection and extends by a non-zero distance from the centre in the direction of each of the plurality of lines.

13. The computer processing system of claim 10, wherein the value of the first attribute of the first line is different to the value of the first attribute for the second line.

14. The computer processing system of claim 10, wherein the at least one intersection is an intersection that has been determined to be formed by a plurality of lines of equal weight, which lines are the lines of the intersection with a highest weight.

15. The computer processing system of claim 10, wherein the displayed area of the intersection is a node that encompasses an area of cross-over of the plurality of lines.

16. The computer processing system of claim 10, wherein the instructions further cause the processing unit to render the displayed area of the intersection with a value for a second attribute that matches a value of the second attribute of the first line.

17. The computer implemented method of claim 16, wherein a value of the second attribute defines another an-aspect of appearance of the line when the table is rendered on a display device.

18. A non-transient storage medium storing instructions executable by processing unit to cause the processing unit to perform a method comprising:

for at least one intersection formed by a plurality of lines of a table, each of the plurality of lines associated with at least a first attribute, wherein a value of the first attribute defines an aspect of appearance of the line when the table is rendered on a display device:

matching a value of the first attribute of a first line of the plurality of lines with a value of the first attribute for at least a second line of the plurality lines, wherein the second line is different to the first line;

based on the matching, rendering a displayed area of the intersection with a value for the first attribute that matches the value of the first attribute of the first line; and matching a value of the first attribute of a third line of the plurality of lines with at least a value of the first attribute for a fourth line of the plurality lines, wherein the first, second, third and fourth lines are different lines;

wherein the rendering with the value for the first attribute that matches the value of the first attribute of the first line is based on the first line having a higher positional dominance than the third line and the fourth line.

* * * * *